United States Patent [19]
Gysling et al.

[11] 3,859,092
[45] Jan. 7, 1975

[54] PHOTOGRAPHIC SYSTEMS BASED ON PHOTOSENSITIVE COPPER (I) COMPLEXES

[75] Inventors: Henry J. Gysling; Richard S. Vinal, both of Rochester, N.Y.

[73] Assignee: Eastman Kodak Company, Rochester, N.Y.

[22] Filed: May 30, 1973

[21] Appl. No.: 365,374

[52] U.S. Cl. .................... 204/15, 96/38.4, 96/48 R, 96/48 PD, 96/88, 117/130 E, 117/212, 260/438.1, 204/38 B

[51] Int. Cl. ............................ G03c 5/00, G03c 5/24

[58] Field of Search ........ 96/48 R, 48 PD, 88, 38.4; 204/38 B, 15; 260/438.1; 117/130 E, 212

[56] References Cited

UNITED STATES PATENTS

| | | | |
|---|---|---|---|
| 3,505,093 | 4/1970 | Schultz | 117/36.8 |
| 3,658,534 | 4/1972 | Ishitani et al. | 96/48 R |
| 3,719,490 | 3/1973 | Yudelson et al. | 96/48 PD |
| 3,790,380 | 2/1974 | McKee et al. | 96/48 PD |

*Primary Examiner*—Norman G. Torchin
*Assistant Examiner*—Won H. Louie, Jr.
*Attorney, Agent, or Firm*—A. H. Rosenstein

[57] ABSTRACT

In a process of forming an image in a light sensitive material employing a chemical developer or physical developer, certain actinic light sensitive copper (I) complexes provide stable latent images which can be developed in room light.

24 Claims, No Drawings

PHOTOGRAPHIC SYSTEMS BASED ON PHOTOSENSITIVE COPPER (I) COMPLEXES

This invention relates to photography and more particularly to a process of forming metallic images in a light sensitive element comprising coating a substrate with a photosensitive copper (I) complex, exposing to actinic light and developing the image.

It is known in the art to employ certain copper (I) salts with silver halide emulsion layers to be exposed to actinic light and developed to an image. U.S. Pat. No. 3,565,622, issued Feb. 23, 1971, describes the use of cuprous thiocyanate with silver halide to form a visible image after development with an amine complexing agent. Additionally some species of copper (I) complexes with ligands and anions are described in S. J. Lippard and P. S. Welcher, Inorganic Chemistry, Vol. 11, No. 1, 1972 (pages 6 to 11).

Thermographic copy sheets incorporating copper (I) complexes as the heat sensitive component are described in U.S. Pat. No. 3,505,093 issued Apr. 7, 1970. This patent describes the overall exposure to heat of the complexes to produce an image.

German Pat. No. 950,428, issued Oct. 11, 1956, describes the use of copper (I) salts such as cuprous chloride as photosensitive compounds. These salts are, however, insensitive to light in the dry state and must be moistened to provide light sensitivity Further, these copper (I) salts are unstable in air.

The use of cuprous oxide as a photosensitive compound has been disclosed in British Pat. No. 1,306,362. These compounds, however, are insensitive to light in the dry state and are not colorless and leave an undesirable background with poor image differential.

The preparation of printed circuits has generally comprised the imagewise exposure of the photoresist material followed by removal of exposed or unexposed areas and etching and subsequent electroplating. This method is expensive, does not allow for room light handling, the raw stock is generally unstable, the bleaching steps or etching steps pose solution disposal problems, and the method requires a multitude of process steps and a great deal of equipment.

No class of copper compounds has been found in the prior art that (1) will form a well defined image after exposure and development; (2) can be handled in normal light; (3) can be exposed in a dry state; and, (4) is stable to the humidity and oxidation due to atmospheric conditions.

Accordingly, it is an object of this invention to provide a method of exposing a photosensivie copper material and developing an image that is resistant to oxidation and stable in the presence of moisture.

It is another object of this invention to provide a method of exposing copper (I) complexes to actinic light to form catalytic centers for decomposition of physical developers.

Still another object of this invention is to provide a method of exposing copper (I) complexes to actinic light so that the complexes can be conveniently prepared and used under ambient lighting conditions.

Yet another object of this invention is to provide a method of exposing copper (I) complexes to actinic light, heating the exposed element to enhance development, and developing to form an image.

Still an additional object of this invention is to provide printed circuits by coating a support with a photosensitive copper (I) complex and exposing imagewise to actinic light and developing the exposed portions of the element by physical development of the latent image.

These objects of the invention are accomplished by employing a metal coordination compound comprising a light sensitive copper (I) complex having a maximum coordination number of 4 and having 1 or more ligands complexed to the copper as the light sensitive material in a process comprising imagewise exposing and either physically or chemically developing a support carrying the light sensitive material. The photosensitive copper (I) complex has a formula represented by $$[CuL_nX] \tag{1}$$

or $$[CuL_m]X' \tag{2}$$

The process comprises imagewise exposing the support and complex to actinic light and chemically or physically developing the latent image.

The described copper (I) complexes are imagewise exposed to actinic light while dry. They are particularly sensitive to actinic light but insensitive to ambient room light so that after imagewise exposure to actinic light an element containing the copper (I) complex can be handled easily in room light without adversely affecting previously unexposed areas.

The class of compounds which may be used in this invention include those having the formulas $$[CuL_nX]$$

and $$[CuL_m]X'$$

In the first instance the copper (I), the ligand, and the anion are all coordinated so that the copper (I) ion has a coordination number of 2, 3, or 4.

L is a ligand which is a monodentate or polydentate class b ligand which, when monodentate, has the formula WZ where W is a group V or group VI donor atom such as nitrogen, phosphorous, arsenic, antimony, bismuth, sulfur, selenium, and tellurium and Z represents the nonmetallic atoms needed to complete the ligand. When the ligand is bidentate, L has the formula BWZ where B and W are donor atoms from group V or group VI and Z is as described above. Where the ligand is tridentate, L has the formula BWYZ where Y is a donor atom and where the ligand is tetradentate, L has the formula BWYY'Z where Y and Y' are as B and W described above.

The class b ligands stabilize copper (I) to oxidation so as to prevent copper (I) from air oxidizing to copper (II). A complete discussion of class b ligands may be found in J. L. Burmeister, Coord. Chem. Rev., 1, 205 (1966) and R. G. Pearson, J. Chem. Education, 45, 581, 643 (1966).

The ligand is monodentate or polydentate. Ligands which are polydentate may coordinate to different metal atoms, or they may coordinate to the same metal atom forming a chelate ring. The ring includes the metal atom as one of the ring constituents as well as two or more ligating atoms from the ligand. Chelating groups having two atoms with unshared electroms are termed bidentate. Chelating groups with three such atoms are designated tridentate and those with more than three such atoms are designated polydentate chelating groups. The ligand compounds are designated in like fashion as bidentate, tridentate or polydentate ligands.

Conventional monodentate and polydentate ligands useful herein are described in Cotton and Wilkinson, *Advanced Inorganic Chemistry*, 2nd ed., N.Y. (1966) pages 139 – 142.

Ligands which are useful herein include monodentate ligands having the formula $WR_3$ or $W(OR)_3$ wherein W is a group V donor atom such as phosphorous, arsenic, antimony and bismuth and R is a lower alkyl radical preferably containing from one to six carbon atoms such as methyl, ethyl, propyl, butyl, pentyl, and hexyl, or aryl preferably containing from six to 12 carbon atoms such as phenyl, tolyl, anthracenyl, phenyl butyl, naphthyl, and the like.

It is understood that the terms "alkyl" and "aryl" throughout the application include substituted alkyl and substitute aryl such as chloromethyl, bromophenyl, phenylbutyl, octyl phenyl and the like. The only limitation is that the substituent cannot adversely affect the photosensitivity of the complex.

Examples of these monodentate ligands are

| | |
|---|---|
| triphenylphosphine | $P(C_6H_5)_3$ |
| tri-p-tolylphosphine | $P[CH_3-⬡-]_3$ |
| triphenylarsine | $As(C_6H_5)_3$ |
| tri-p-tolylarsine | $As[CH_3-⬡-]_3$ |
| triphenylstibene | $Sb(C_6H_5)_3$ |
| trinaphthylphosphine | $P(C_{10}H_7)_3$ |
| tributylphosphine | $P(C_4H_9)_3$ |
| tripropylarsine | $As(C_3H_7)_3$ |
| triethylphosphine | $P(C_2H_5)_3$ |
| trimethoxyphosphine | $P(OCH_3)_3$ and the like. |

Other useful monodentate ligands include compounds having the formula $W'(R')_2$ wherein W' is a donor atom from group VI such as sulfur, selenium and tellurium and R' is a lower alkyl radical preferably containing from one to six carbon atoms such as methyl, isopropyl, pentyl, hexyl and the like; aryl such as phenyl, naphthyl, anthracenyl, tolyl, phenyl butyl and the like preferably containing from about six to about 12 carbon atoms. Examples of these compounds include: propyl sulfide, isopropyl sulfide, pentyl sulfide, ethyl selenide, butyl selenide, methyl telluride, pentyl telluride, phenyl sulfide, tolyl sulfide, phenyl selenide, p-propylphenyl-selenide, phenyl telluride, p-butylphenyl telluride, naphthyl sulfide, naphthyl selenide, naphthyl telluride, thiourea, selenourea and the like.

Useful polydentate ligands include compounds having the formula BWZ wherein B and W are donor atoms from group V or group VI such as nitrogen, phosphorous, sulfur, selenium, tellurium, bismuth and the like, and Z is as described above. Examples of these bidentate ligands are 1,3-bis(methylthio)-propane, 1,8-bis(methylthio)octane, 1,5-bis(propylthio)pentane, 1,2-bis(phenylthio)ethane, 1,5-bis(ethylseleno)-pentane, 1,4-bis(butylseleno)butane, 1,2-bis(phenylseleno)ethane, 1,4-bis(methyltelluro)butane, 1,4-bis(ethyltelluro)butane, 1,4-bis(phenyltelluro)butane and the like.

Ligands containing nitrogen can also be useful Lewis bases for the compounds when the nitrogen atom is incorporated in an unsaturated organic molecule. Such Class b ligands are known to stabilize low valent metal ions such as copper (I). Examples of N containing ligands are 2,2'-bipyridine, 1,10-phenanthroline and dinitriles succh as adiponitrile, succinonitrile, glutaronitrile, suberonitrile, sebaconitrile, octadecamethylene-1,18 dinitrile and the like.

The value of *n* is from 1 to 3 when L is monodentate and 1 or 2 when L is polydentate.

X is a monovalent coordinating anion. Examples of this art recognized class of materials are $BH_3CN$, $N_3$, $NO_3$, halide ions such as Cl, Br, and I, and boranes such as $BH_4$ and $B_9H_{14}$. Monovalent coordinating anions useful herein are described in Cotton and Wilkinson, *Advanced Inorganic Chemistry*, 2nd ed., Chapter 26, N.Y. (1966).

In the complex $[CuL_m]X'$, the ligand is coordinated to the copper (I) but the anion is not coordinated with the copper (I). The coordination number of the Cu ion due to complexation by L is 4.

*m* is either 2 or 4 and L is as described above. It is noted, however, that when *m* is 2, L is a bidentate ligand such as 1,2-bis(phenylseleno)ethane, 1,4-bis(ethyltelluro)butane, or the like and when *m* is 4, L is a monodentate ligand such as propyl sulfide, triphenylphosphine, triphenylstibene, tripropylarsine or the like.

X' is a non-coordinating monovalent anion. Examples of non-coordinating anions useful herein are those having the formula B(DEFG) wherein D, E, F, and G are independently selected from the group consisting of aryl and alkyl such as tetraethylborate, tetraphenylborate and the like; perchlorate; nitrate; or tetrafluoroborate; and the like. It is noted that some non-coordinating anions can coordinate in certain cases depending on the nature of the ligands in the coordination sphere. thus, nitrate is coordinated in $Cu[P(C_6H_5)_3]_2NO_3$, but non-coordinated in $Cu[NC(CH_2)_4CN]_2NO_3$. See M. J. Nolte G. Gafner, and L. M. Haines. *Chem. Commun.*, 1406 (1969), and W. A. Anderson et al., *Canadian Journal of Chemistry*, 49, 761 (1971).

It is pointed out that L may be a mixture of different ligands if desired.

Examples of copper (I) complexes which are photosensitive to actinic light and stable to ambient light are $Cu[NC(CH_2)_4CN)]_2NO_3$
$Cu[As\ (C_6H_5)_3]_2\ B(C_6H_5)_4$
$Cu[As(C_6H_5)_3]_2\ Cl\ .\ CHCl_3$
$Cu[As(C_6H_5)_3]_3NO_3$
$Cu[PS(C_6H_5)_3]Cl$
$Cu[(p - CH_3-C_6H_4)_3P]_3Cl$
$Cu[P(p-CH_3-C_6H_4)_3]_3BH_3CN$
$Cu[Sb(C_6H_5)_3]_3BH_3CN\ .\ CHCl_3$ $Cu[P(C_6H_5)_3]_3BH_3CN \cdot CHCl_3$
$Cu[P(p{-}CH_3C_6H_4)_3]_2N_3$
$Cu[P(C_6H_5)_3]_2N_3$
$Cu[Sb(C_6H_5)_3]_3NO_3$
$Cu[(C_6H_5)_2PCH_2CH_2P(C_6H_5)_2]Cl$
$Cu[(C_6H_5)_2PCH_2CH_2P(C_6H_5)_2]BH_3CN$
$Cu[P(C_6H_5)_3]_2NO_3$
$Cu[P(p\text{-}CH_3C_6H_4)_3]_2NO_3$
$Cu[As(C_6H_5)_3]_2BH_3CN$
$Cu[P(OCH_3)_3]_4\ B(C_2H_5)_4$
$Cu[P(OCH_3)_3]_1\ BH_3CN$
$Cu[P(C_6H_5)_3]_2B_3H_8$
$Cu[(p{-}CH_3{-}C_6H_4)_3P]_2B_3H_8$
$Cu[P(C_6H_5)_3]_3B_9H_{14}$
$Cu[P(C_6H_5)_3]_2B_9H_{14}$
$Cu[P(C_6H_5)_3]_2BH_4$
$Cu[(C_6H_5)_2P\ CH_2CH_2P(C_6H_5)_2]BH_4$ $$Cu\left[\left(\begin{matrix}C_6H_5\\ |\\ P{-}CH_2\\ |\\ C_6H_5\end{matrix}\right)_3 CCH_3\right]Cl$$

and the like.

The complexes which may be exposed to actinic light and developed to form a metallic image may be prepared by a number of known methods. The general method is to complex a copper salt such as copper halide with an appropriate neutral ligand and then introduce an anion or non-coordinating anion which imparts photosensitivity to the complex.

The primary method of obtaining the copper (I) complexes is to react a solution of ligand in any of a number of solvents such as chloroform, methylene chloride, ethylene chloride, acetonitrile and the like with copper (I) salts of anions by merely mixing the materials, filtering, and drying. An example is $Cu[As(C_6H_5)_3]_3Cl$ which is formed by mixing $As(C_6H_5)_3$ in solution with chloroform and CuCl. No special reaction conditions are necessary and the reaction can be carried out generally from 0°C to 100°C. In some cases the copper salt may be in solution and the ligand may be in the solid state. In some cases the reaction product may be further reacted with a solution of a salt of a desired anion to form a more preferred complex by a methathesis reaction. An example of this is reacting the $Cu[As(C_6H_5)_3]_3Cl$ with $NaBH_3CN$ to form $Cu[As(C_6H_5)_3]_3BH_3CN$. The above general methods of preparing copper (I) complexes of the type described herein are described in T. L. Davis and P. Ehrlich, *J. American Chemical Society*, Vol. 58, 2151(1936) and A. Arburzov, Ber., 38, 1171 (1905).

The complexes may also be prepared by in situ reduction of Cu(II) by reducing Cu(II) with an excess of the ligand, usually in the presence of an alcohol such as ethanol, or a suitable polar solvent for the copper (II) salt such as acetonitrile, and adding a solution of a salt of the anion to form the complex. An example of this is dissolving $CuSO_4.5H_2O$ in water and ethanol and triphenylphosphine and adding $(CH_3)_4NB_3H_8$. This type of preparation is described in J. M. Jenkins, T. J. Huttemann and J. Gl Verkade, Advances in Chemistry Series, No. 62, American Chemical Society, Washington, D.C., 1967, Page 604, J. M. Davidson, *Chem. and Ind.*, 2021 (1964), S. K. Siddhanta and S. N. Banerjee, *J. Ind. Chem., Soc.*, 38, 747 (1961).

Generally the copper salt and ligand may be reacted using any proportions, but it is preferred to add from about 0.1 to about 1.0 mole of copper salt for every mole of ligand.

The photosensitive complex may be either imbibed into a substrate or coated on to the substrate in a hydrophilic binder prior to imagewise exposure. Thus the substrate may be dipped in a bath of the complex and dried to render the element photosensitive. If desired, a method which is specifically useful in forming printed circuits comprising adding the complex to a binder solution and coating onto the substrate by any means, such as dip coating, brushing, rolling, spraying or the like and then drying may be used.

The binder used as a vehicle for the photosensitive complex may be any of the hydrophilic binders used in photographic elements, including natural materials such as gelatin, albumin, agar-agar, gum arabic, alginic acid etc., and synthetic materials such as polyvinyl alcohol, polyvinyl pyrrolidone, cellulose ethers, partially hydrolized cellulose acetate and the like. It is understood that although many binders may be used herein, the binder should not absorb appreciably in the region of sensitivity of the complex. The complex may be used with varying amounts of binder material. Preferably the complex to binder weight ratio is from about 3 : 1 to about 1 : 2.

The complex may be either imbibed into or coated onto any support typically used for photographic elements. Support materials used herein are subject to wide variation. Glass may be employed as may be metals such as aluminum, copper, zinc, and tin. Conventional film bases, such as cellulose acetate, cellulose nitrate, cellulose acetate butyrate, polyethylene terephthalate), polystyrene and paper including polyethylene coated paper and polypropylene coated paper are also used. If the complex is to be imbibed in the support, porous materials such as paper should be used. The preferred support materials, when the process is to be used to form an element for use as a printed circuit, are poly(ethylene terephthalate), polyimides and cellulose acetate.

The coated support is dried and may then be stored for convenient periods of time prior to imagewise exposure as the complexes are not sensitive to ambient light, nor to the humidity in the atmosphere.

The elements are typically exposed through a pattern of actinic radiation providing a latent image corresponding to the exposed or unexposed areas. The complexes are sensitive to actinic light such as ultraviolet rays generally in the wavelength range of 1,800 to 4,000 Angstroms. Many sources of ultraviolet light may be used such as high vapor mercury lamps, carbon arc lamps, and the like. The complexes may generally be exposed for at least 5 seconds and preferably from 5 to about 60 seconds.

In some instances, the rate of development of the coated supports is considerably accelerated by heating the exposed elements prior to treatment with the developer. In this respect, a shorter exposure time to achieve a developable image may be used if the element is heated after exposure and prior to development. Generally, the element may be heated to about 100°C to about 200°C for about 1 to 60 seconds to exhibit this effect.

The latent image in the exposed elements can be developed into a desired metal image, typically a visible image, by either physical development or chemical development.

The physical development may take place in any conventional physical developing bath. The physical development bath generally contains metal ions in salt form and a reducing agent for the metal ions. Typical physical developer solutions are well known (see Hornsby, *Basic Photographic Chemistry*, (1956) 66, and Mees and James, ed. *The Theory of the Photographic Process*, 3rd edition (1966), 329–331, and U.S. Pat. No. 3,650,748 to Yudelson et al., issued Mar. 21, 1972) and contain the metallic ions such as silver, copper, iron, nickel, or cobalt necessary to form a visible image at and in the vicinity of the nucleating centers.

The preferred metal salts are water soluble salts such as silver nitrate, cupric salts such as copper chloride, copper nitrate, copper sulfate, copper formate, copper acetate and the like, and nickel salts such as nickel chloride, nickel bromide, nickel sulfate, nickel nitrate, nickel formate and the like.

Typical reducing agents used in the physical developer include, for example, polyhydroxy-substituted aryl compounds such as hydroquinones, catechols and pyrogallols; ascorbic acid derivatives; amino-phenols; p-phenylenediamines, and the like developing agents used in the photographic art. Particular examples of reducing agents for physical developer solutions are 2-methyl-3-chlorohydroquinone, bromohydroquinone, catechol, 5-phenyl-catechol, pyrogallol monomethyl ether (1-methoxy-2,3-dihydroxybenzene) and 5-methylpyrogallol monomethyl ehter, isoascorbic acid, N-methyl-p-aminophenol, dimethyl-p-phenylene diamine, 4-amino-N,N-di(n-propyl) aniline and 6-amino-1-ethyl 1,2,3,4-tetrahydroquinoline. Borane reducing agents such as amineboranes, borohydride, and the like may also be used.

The preferred physical development baths include the Copper Enthone developer baths (a trademark of Enthonics Corp.) containing copper sulfate, formaldehyde, Rochelle salt, and nickel sulfate.

The physical developer solutions in addition to the metal salt, reducing agent, and complexing agent for the metal salt such as Rochelle salt or other ligands for the metal salt, can include a variety of other materials to facilitate maintenance and operation of the developer and to improve the quality of the developed image, such as acids and bases to adjust pH, buffers, preservatives, thickening agents, brightening agent, and the like. The rate of development can be increased and hence the time of development decreased, by adding to the developer solution a surfactant such as an alkyl metal salt of a sulfated fatty acid, e.g., dodecyl sodium sulfate.

The proportions in which the various components of the physical developer are present in the developer solution can vary over a wide range. Suitable concentrations of reducible heavy metal salt can range from about 0.01 mole to about 1.0 mole of metal salt per liter of solution. The upper limit of concentration is dependent upon the solubility of the particular metal salt employed. Preferably, the solution is about 0.1 molar to about 0.3 molar with respect to the heavy metal salt. The relative proportions of metal salt and complexing agent are dependent upon the particular heavy metal salt or salts and the particular complexing agent or agents which are employed. As a general rule, sufficient complexing agent should be incorporated to "tie up" the reducible heavy metal ions which are in solution and to lessen the tendency of these metal tions to be reduced prior to use of the developer solution. Depending upon the particular heavy metal salt and the particular complexing agent which is employed, the amount of complexing agent present typically can vary from about 0.2 mole to about 10 moles or complexing agent per mole of metal salt present. Typically, the reducing agent can be present in amounts from about 0.01 mole to about 5 moles of reducing agent per mole of metal salt present in the solution. In order to permit the developer solution to be utilized for its maximum life, at least one equivalent of reducing agent should be present in the solution for each equivalent of reducible heavy metal salt.

The physical developers are operative over a wide range of pH. However, since the borane reducing agents undergo an acid catalyzed hydrolytic reaction which reduces their stability during storage, it is preferred that the physical developers be maintained at a moderately alkaline pH of about 8 to 11, and preferably of about 8.5 to 9.5. Nevertheless, the physical developers can be used under acidic conditions, as low as pH 3, if such conditions are advantageous for the particular photographic process in which they are used. The physical developer solution can be brought to the desired pH by addition of an appropriate amount of a suitable base; for example, ammonium hydroxide or sodium hydroxide, and can be maintained at the desired pH by addition of a suitable buffering system, for example, sodium carbonate and sodium bicarbonate. Other materials which can be used to adjust the pH to the desired range and buffers which will maintain the pH in that range can be readily determined by those skilled in the art.

The exposed elements may also be developed chemically by immersing in solutions comprising aminophenols, phenyleneamines, hydroquinones, amino-dialkylanilines, heterocyclic chemical developers such as phenyl pyrazolidone and the like. A complete description of chemical developer solutions which may be used herein can be found in Mees and James, *The Theory of the Photographic Process*, 3rd ed., Chapter 13 (1966).

The process outlined above may yield a positive or negative image depending on the nature of the photosensitive complex used and the development process. Thus, negative images may be obtained by exposing $Cu[NC(CH_2)_4CN]_2B(C_6H_5)_4$ to actinic light and developing in a Copper Enthone developer and a positive image may be obtained by exposing the same material to actinic light and developing in a nickel physical development bath.

Certain of the developed elements of the invention are especially advantageous as they have add-on capabilities. That is, the complexes remaining in the unexposed areas are not affected by ambient light and portions of the developed element may be further imagewise exposed to actinic light and developed to produce an additional image on the element.

The process of this invention is particularly useful in forming elements for use as printed circuits. In this method, insulating supports are either imbibed with the copper (I) complexes or coated with the complexes in a binder and dried. The coated supports are imagewise exposed to actinic light so that the exposed portions are catalytic to the physical deposition of a metal such as copper, silver or nickel by physical development. The exposed element is then physically developed in a metal salt containing bath such as in a copper physical development bath and the metal such as copper is deposited and built up on the exposed portions of the element only. The element may then be dried and if desired, a heavier build up of metal may be achieved in the exposed areas by electroplating over the element. the completed element may then be used to form a printed circuit.

The following examples are included for a further understanding of the invention.

Example 1

A photosensitive complex was formed by reacting 20 m moles of cuprous chloride and 80 m moles of triphenylarsine in 100 mls of chloroform. The mixture was stirred for 5 minutes, filtered, and diluted with excess ehtanol. The resulting complex $Cu[As(C_6H_5)_3]Cl$ was a white solid.

A strip of paper was impregnated with a 5 percent solution of the above complex in chloroform and dried. A ten minute imagewise exposure of the paper to actinic radiation employing a 350-watt Gates lamp at a distance of 12 inches was followed by uniform heating at 150°C for 15 seconds and the exposed areas were physically developed by immersion of the element in a physical developing solution comprising 100 mls of a solution comprising 213 grams of nickel chloride, 28.8 grams of citric acid, and 164 grams of ethanolamine dissolved in sufficient water to fill a volume of 4 liters and 50 mls of water containing 1.6 grams of dimethylamine borane. A copper image was formed in the exposed areas.

Example 2

A photosensitive copper (I) complex was prepared by reacting 13 m moles of cuprous chloride with 50 m moles of triphenylstibine in 100 ml of chloroform. After stirring the reaction solution for 30 minutes, it was filtered and diluted with 300 ml of ethanol. The solution was cooled for 8 hours and produced a white solid having the formula $Cu[Sb(C_6H_5)_3]_2Cl$.

A 4 percent by weight solution of the complex in acetonitrile was imbibed into a strip of paper. The coating was dried and then imagewise exposed to actinic light employing a 350-watt Gates lamp at a distance of 12 inches for 3 minutes. The exposed areas were physically developed employing the bath and procedure described in Example 1. A copper image was formed.

Example 3

A photosensitive complex was prepared by reacting 4 m moles of the complex of Example 2 of 200 ml of chloroform with 4.3 m moles of $NaBH_3CN$ dissolved in 50 ml of ethanol. After stirring for one hour, the solution was filtered and diluted with excess ethanol and subsequently cooled for several hours. The product was a white solid precipitate having the formula $Cu[Sb(C_6H_5)_3]_2BH_3CN$.

A 2 percent solution of the complex in acetonitrile was imbibed into a strip of paper, dried and imagewise exposed to actinic radiation under a 350-watt Gates lamp for ten minutes at a distance of 12 inches. The exposed paper was uniformly preheated for 5 seconds at 120°C and physically developed by immersion of the element in the commercially available Copper Enthone physical developing solution. A copper image was formed The same process was repeated with the exception that the exposed paper was uniformly preheated at 120°C for 15 seconds before development. After development in the Copper Enthone developer solution, an image reversal took place wherein the unexposed region of the coated paper catalyzed the decomposition of the physical development bath while the exposed region became catalytically inert.

Example 4

A photosensitive complex was prepared by adding 1.98 grams of solid CuCl to a solution of 24.5 grams of triphenylarsine in 100 ml of chloroform. A clear, colorless solution resulted immediately, however, after 5 minutes a heavy white precipitate formed. The reaction solution was then diluted to 900 mls with chloroform stirred for one half hour and filtered. The resulting complex had the formula $Cu[As(C_6H_5)_3]_2Cl.CHCl_3$.

The above complex was treated with a solution of 1.26 grams of $NaBH_3CN$ and 100 ml enthanol. The resulting solution was stirred for one half hour and diluted with a like amount of ethanol. After cooling the solution overnight the resulting white needles were filtered, washed with ethanol and ether and vacuum dried. The resulting complex had the formula $Cu[As(C_6H_5)_3]_3BH_3CN.CHCl_3$.

A 2 percent solution of the complex in acetonitrile was imbibed in a paper strip, dried and imagewise exposed to actinic radiation under a 350-watt Gates lamp for 10 minutes at a distance of 12 inches. The exposed paper waas uniformly heated for 5 seconds at 150°C and immersed in the nickel physical development bath described in Example 1. Development resulted only in the unexposed region of the coated paper.

Example 5

A photosensitive complex was prepared by adding 6.04 grams of $Cu(NO_3)_2.3H_2O$ in 400 ml boiling methanol to 30.6 grams of triphenylarsine. The solution was refluxed for 15 minutes, and then cooled for 2 days. The resulting white crystalline material was filtered and washed with ethanol and ether and had the formula $$Cu[As(C_6H_5)_3]_3NO_3.$$

A paper base was imbibed with a solution of 0.5 g of the complex in 10 ml of chloroform. After a 60-second, 360-watt Gates lamp imagewise exposure, the complex was physically developed to a negative image by immersing in a developer comprising 100 mg of methylhydrazinebisborane in 100 ml of the nickel physical developer:

| | | |
|---|---|---|
| $NiCl_2 \cdot 6H_2O$ | 68.75 | g |
| ethylenediamine | 45 | g |
| $KCH_3CO_2$ | 225 | g |

and water to a volume of 3 liters.

A test paper imbibed with the above complex was heated for 15 seconds at 170°C after the exposure and developed to produce development only in the unexposed area of the paper.

Example 6

A photosensitive complex was prepared by adding 1 g of solid CuCl to a solution of 9.7 g of triphenylphosphine sulfide and 300 ml chloroform. The resulting clear colorless solution ws stirred for 15 minutes, diluted with 1.5 liters of ethanol and cooled to give a white solid. The solid was filtered, washed with ethanol and ether and vacuum-dried and had the formula $Cu[PS(C_6H_5)_3]Cl$.

A paper base was imbibed with a solution of 1 g of the complex and 20 chloroform. After a 2-minute imagewise exposure under a UVS-11 Mineralight lamp the latent image was chemically developed by dipping in a bath comprising an aqueous solution of 7 percent by weight dimethylamineborane and 10 percent by weight ethanol amine.

Example 7

Solid CuCl (0.8 g) was added to a solution of 9 g of tri-p-tolylphosphine in 40 ml chloroform. The solution was concentrated on a hot plate to give a viscous residue which on trituration with 50 ml of hexane gave a white solid. The solid was filtered, washed with ethanol and ether and vacuum-dried to yield 4.8 g of a product having the formula $Cu[P(p\text{-}CH_3—C_6H_4)_3]_3Cl$.

A paper support was imbibed with a solution of 0.5 g of the complex and 10 ml of chloroform and imagewise exposed to actinic light for 10 minutes under the 360-watt Gates lamp at a distance of 12 inches. The coated paper was developed to a negative image by immersion in a developer comprising 100 mg methylhydrazinebisborane in 100 ml of the nickel developing bath described in Example 1.

Example 8

A solution of 0.15 g $NaBH_3CN$ in 7 ml ethanol was added to a solution of 2 g tris(tri-p-tolyphosphine) copper (I) chloride in 25 ml chloroform. The resulting solution was stirred one and half hours and filtered, diluted to 450 ml with ethanol and cooled to yield a crop of white crystals having the formula $Cu[P(p-CH_3-C_6H_4)_3]_3BH_3CN$.

A paper base was imbibed with a solution of 0.5 g of the complex in 15 ml chloroform. After a 60-second imagewise exposure under a 360-watt Gates lamp at a distance of 12 inches. The coated paper was developed to a positive image by immersion in a Copper Enthone physical development bath maintained at 65°C.

Example 9

To a solution of 19.1 g $Sb(C_6H_5)_3$ in 200 ml chloroform were added 1.65 g of solid CuCl. The solution was refluxed 10 minutes and filtered. To the filtrate was added 1.36 g of a solution of $NaBH_3CN$ in 40 ml of ethanol. After stirring the solution for one hour a heavy white precipitate formed and was isolated by filtration on a fine sintered glass filter. The resulting complex had the formula $Cu[P(C_6H_5)_3]_3BH_3CN.CHCl_3$.

A paper base was imbibed with a solution of 250 mg of the complex and 6 ml chloroform. After a 60-second imagewise exposure to actinic light under a 360-watt Gates lamp at a distance of 12 inches, the coated paper was developed to a positive image by immersion in a Copper Enthone physical reducing bath at 65°C.

Example 10

To a solution of 29.4 g $As(C_6H_5)_3$ in 350 ml $CHCl_3$ were added 3.1 g of cuprous chloride. After stirring for one minute, a solution of of 2.07 g of $NaBH_3CN$ in 50 ml ethanol was added. The solution was stirred for one hour and filtered through a fine porosity sintered filter. After diluting the filtrate to 2 liters with ethanol, and cooling, a white solit complex resulted having the formula $Cu[As(C_6H_5)_3]_3BH_3CN.CHCl_3$.

A paper base was imbibed with a solution of one gram of the complex dissolved in 20 ml chloroform. After imagewise exposing for 5 seconds to actinic light under a 360-watt Gates lamp, at a distance of 12 inches, the coated paper was developed to a negative image by immersion for 2 minutes in a Copper Enthone developer which was maintained at 65°C. The exposed element prior to development was allowed to stand 24 hours at room temperature with no adverse effects on the image obtained after development.

The threshold exposure for subsequent development in the Copper Enthone developer for the above complex was determined by a series of 30 second exposures through a set of neutral density filters. The light source was UVS–11 Mineralight emitting at 254 nm. A threshold value of $4.8 \times 10^3$ ergs/cm$^2$ was found. The region of sensitivity of this complex towards subsequent development in 65°C Copper Enthone developer extended from 225 nm to 320 nm.

Example 11

To a solution of 20.5 g of triphenylphosphine in 500 ml chloroform were added 2.5 g of solid CuCl. After stirring 2 minutes, a solution of 1.95 g of $NaN_3$ in 120 ml warm methanol was added. The solution was stirred for a half hour and filtered through a glass frit. The filtrate was concentrated to dryness and the residue, after washing with cyclohexane, was recrystallized from 300 ml boiling chloroform to give 6.3 g of a complex having the formula $Cu[P(C_6H_5)_3]_2N_3$.

A paper base was imbibed with a solution of 700 mg of the complex in 30 ml chloroform. After a 5 second imagewise Gates lamp exposure at a distance of 12 inches followed by uniform heating for 15 seconds at 168°C, physical development was effected by immersing for 5 minutes in a solution consisting of 100 mg of methylhydrazinebisborane in 100 ml of the nickel physical developer of Example 1. This resulted in a black negative image.

Example 12

To a solution of 16.8 g of bis(1,2-diphenylphosphine) ethane in 250 ml benzene were added 4 g of solid CuCl. This mixture was stirred and refluxed for one hour and filtered, washed with benzene and ether and recrystallized from boiling benzene. The resulting complex had the formula $Cu[(C_6H_5)_2PCH_2CH_2P(C_6H_5)_2]Cl$.

A paper base was imbibed with a solution of 1 g of the complex in 25 ml of warm chloroform, and imagewise exposed to actinic light for 60 seconds under a 360-watt Gates lamp at a distance of 12 inches. The development was carried out in the nickel developer described in Example 5 and a positive image was obtained.

Example 13

To a solution of 24.2 g of $Cu(NO_3)_2.3H_2O$ in 500 ml boiling methanol were added 122 g of tri-p-tolylphosphine. This solution was refluxed fro 5 minutes and concentrated to 300 mls and cooled to 0°C to form pale green crystals. The crystals were filtered and washed with ether and recrystallized from 900 mls boiling methanol to yield 27 g of a white crystalline material having the formula $Cu[P(p\text{-}CH_3C_6H_4)_3]_2NO_3$.

A paper base was imbibed with a solution of 1 g of the complex and 20 ml of chloroform. After a 60-second imagewise exposure to actinic light under a UVS-12 Mineralight lamp, at a distance of 1.5 centimeters, the material was heated for 20 seconds at 190°C, to produce a yellow negative image. This image was developed to a black image by immersion in the nickel physical developer described in Example 5.

Example 14

To a solution of 5.2 g of tri-p-tolylarsine dissolved in 200 ml chloroform was added 0.5 g of cuprous chloride. After stirring for 10 minutes, a solution of 0.5 g $NaBH_3CN$ in 60 ml methanol was added and after further stirring for 15 minutes the solution was filtered through a fine porosity glass frit. The product was isolated from the filtrate and recrystallized in a 2 : 1 cyclohexane to chloroform solution. The resulting complex had the formula $Cu[As(p\text{-}CH_3C_6H_4)_3]_3BH_3CN$.

A film of the complex was prepared by dissolving 400 mg of the complex and 3.0 ml chloroform and mixing with 10 ml of a 10 percent by weight cellulose acetate solution in 1 : 1 acetone-methoxyethanol. The resulting solution was then coated to a 6 mil wet thickness on polyethylene terephthalate). After drying the film was subjected to a 5 second imagewise Gates lamp exposure and developed to a positive image by immersion in a nickel developer prepared by dissolving 100 mg of methylhydrazenebisborane in 100 ml of a solution comprising 0.1 M $NiCl_2.6H_2O$ 0.25 M ethylenediamine, and 0.77 M $KCH_3CO_2$.

Example 15

A copper (I) complex was prepared by dissolving 2 g $CuSO_4.5H_2O$ in 35 ml of water and adding 105 ml ethanol and 8 g of triphenylphosphine. This solution was warmed and filtered. To the filtrate was added 1.7 g of $(CH_3)_4NB_3H_8$ dissolved in 100 ml ethanol and 50 ml water. A heavy white precipitate settled out of the solution. This was filtered and washed with methanol and ether. The white solid was dissolved in 60 ml of tetrahydrofuran and the solution was filtered, cooled to 0°C, and the solution was filtered and the solid recrystallized from 80 mls of a 1 : 1 acetone-cyclohexane solution. The product obtained had the formula $Cu[P(C_6H_5)_3]_2B_3H_8$.

A solution of 0.7 g of the complex in 15 ml of chloroform was imbibed into paper stock and the paper was allowed to dry at room temperature. The imbibed paper was exposed imagewise to actinic light for 10 minutes under a 400 watt Gates lamp, at a distance of 12 inches, then physically developed only in the exposed areas by immersion in a physical development bath containing the following physical developer solution.

| | |
|---|---|
| $NiCl_2{\cdot}6H_2O$ | 82 g |
| Nitrilotriacetic acid | 19 g |
| Ethanolamine | 67 g |
| Water added to 1 liter | |

The physical development bath was prepared by adding a solution of 1.6 g of dimethylamineborane and 50 ml of water to 100 ml of the developer solution.

Example 16

A metal image was obtained by imbibing into paper stock 0.2 g of the complex $Cu[(p\text{-}CH_3C_6H_4)_3P]_2B_3H_8$ in 10 ml of chloroform. The imbibed paper was dried at room temperature and exposed imagewise to a 400-watt Gates lamp at a distance of 12 inches. After a 5 minute exposure the exposed area with physically developed in a Copper Enthone physical developing solution at 60°C for 10 seconds.

Example 17

A photosensitve copper complex wazs prepared by adding 11.1 g of triphenylphosphine to 100 ml of a methanol solution of $CuSO_4.5H_2O$. The solution was cooled and to it was added 1.5 g of $NaBH_4$. The white solid precipitate obtained was filtered, washed with ethanol and ether, and dissolved in 60 ml of chloroform. The solution was filtered and concentrated to give fine white crystals having the formula $Cu[P(C_6H_5)_3]_2BH_4$.

Into paper stock was imbibed 0.3 of the complex dissolved in 10 ml of chloroform. The imbibed paper was dried at room temperature and after a 10 minute imagewise exposure to actinic light under a 400-watt Gates lamp at a distance of 12 inches the exposed areas were physically developed by immersion in the developer bath described in Example 16 to a heavy black image.

Example 18

A mixture of 8.5 g $AgNO_3$ and 10 g Cu metal powder in 100 ml adiponitrile was heated to about 60°C for one-half hour, filtered, and allowed to crystallize upon cooling. An equal volume of methylene chloride was added and the slurry was filtered and washed with methylene chloride. The product was dried in a vacuum. The resulting complex having a melting point of 160°–162°C has the formula $Cu[NC(CH_2)_4CN)]_2NO_3$.

A mixture of 1 g of the complex and 1 g $NaB(C_6H_5)_4$ in 30 ml of acetonitrile was filtered and coated on filter paper. The filter paper was dried and exposed imagewise to a UVS–11 Mineralight lamp for 5 seconds at a distance of 1.5 centimeters. The exposed paper was developed to a negative copper image by immersion in a Copper Enthone physical development bath.

Example 19

The light sensitive materials of Example 18 were exposed to a UVS–11 Mineralight lamp for 10 seconds at a distance of 5 mm and dipped in a saturated solution of $AgNO_3$ in methanol and developed to a negative image by immersion in a silver development bath formed by mixing the following two solutions:

A. 8.5 g $AgNO_3$ and 19.2 g citric acid in 500 ml of solution, and

B. 35 g p-methylaminophenol sulfate in 500 ml of solution and 0.02 weight percent surfactant. A slight excess of solution A was used.

Example 20

A copper (I) complex having the formula

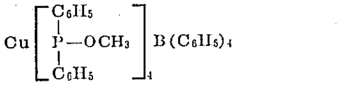

was prepared by adding 2.4 g $Cu(NO_3)_2.3H_2O$ in 100 ml of methanol to 23 ml of methoxydiphenylphosphine in 100 ml methanol and precipitating the product with a solution of 3.5 g of $NaB(C_6H_5)_4$ in 50 ml methanol. The resulting solution was diluted to 350 ml with methanol and warmed to 55°C. After cooling to − 10°C 3.7 g of a crop of white crystals was obtained.

A paper support was imbibed with a solution of 200 mg of the above complex in 5 ml of acetone. The threshold exposure of the coated paper support necessary for subsequent physical development in Copper Enthone developer at 65°C was evaluated by exposing through a set of neutral density filters at 255 nm. The light source was a Bausch and Lomb high intensity monochrometer and the radiant energy was measured by the YSI-Kettering Model 65A radiometer. A threshold exposure value of $5 \times 10^5$ ergs/cm² was obtained. The diffuse reflection spectrum of the sensitized paper showed an absorption maximum at 266 nm.

Example 21

A copper (I) complex having the formula $Cu[P(OCH_3)_{0.84}(OC_4H_9)_{0.16}(C_6H_5)_2]_4B(C_6H_5)_4$ was prepared by adding 27 ml of n-butoxydiphenylphosphine to a solution of 4.8 g $Cu(NO_3)_2.3H_2O$ in 500 ml of methanol. The product was mixed with $NaB(C_6H_5)_4$. The complex was analyzed and found to contain the following:

| | |
|---|---|
| C | 73.5 |
| H | 6.2 |
| Cu | 4.4 |
| P | 10.0 |

The 90 MHz pmr spectrum of this product in $CDCl_3$ supports the proposed formulation.

A paper support was imbibed with a solution of 500 mg of the complex in 10 ml of acetone. The diffuse reflection spectrum of the paper showed an absorption maximum at 275 nm. The region of sensitivity and threshold exposure necessary for subsequent physical developement of the coated paper using a Copper Enthone Physical developer at 65°C and a Bausch and Lomb high intensity monochrometer were determined. It was found that the region of sensitivity was extended to 375 nm and the threshold exposure at 275 nm was $7.9 \times 10^4$ ergs/cm$^2$.

Example 22

A solution comprising 5 g of Cu-$[As(C_6H_5)_3]_3BH_3CN.CHCl_3$, 10 g of poly(ethyl acrylate co acrylic acid), 4 drops of butane diol bis(glycidyl ether), and 85 ml chloroform was coated onto a poly(ethyleneterephthalate) support at a wet thickness of 0.006 inch. The coating was dried overnight at room temperature.

A printed circuit was prepared by exposing the dried element to a low pressure mercury arc through a stainless steel mask for three minutes. The exposed element was then physically developed in a 1 : 1 Copper Enthone 400A–400B electroless plating bath for 30 minutes at 32°C. A 5micron electrically conducting image appeared at the exposed portion at the end of this development.

The image is capable of being electroplated with additional copper to produce a thicker conductor.

Example 23

A 5 percent chloroform solution of

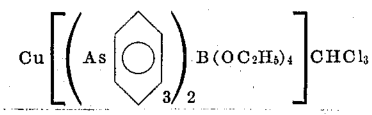

was imbibed into a paper support and dried. After exposure to a Gates mercury lamp for 1 minute at a distance of 12 inches the element was immersed in a chemical developer having the following composition:

| | |
|---|---|
| Dimethylamine borane | 7 gms. |
| Ethanolamine | 10 gms. |
| Water | 83 gms. |

After an immersion of 15 minutes, an image appeared in the exposed areas.

Example 24

A strip of filter paper was imbibed with a solution of 5 g of

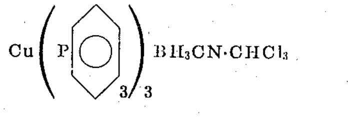

in 100 ml of chloroform and dried. the element was exposed for 1 minute to an unfiltered Gates lamp at a distance of 12 inches through a steel mask and developed for 1 minute in the following developer:

| | |
|---|---|
| $NiCl_2 \cdot 6H_2O$ | 21.3 gms. |
| Citric Acid | 28.8 gms. |
| Ethanolamine | 164.0 gms. |
| Water added to 1 liter | |

and mixed with 5 g of dimethylamine borane. A dense black image appeared in the exposed portions of the paper while the unexposed areas remained white.

After development, the paper was exposed in the portions of the white areas for 1 minute under the same conditions as described above, and the sample was immersed for 1 minute in the same developer. An excellent image appeared in the newly exposed areas and the original image remained unchanged.

Although the invention has been described in considerable detail with reference to certain preferred embodiments thereof, it will be understood that variations and modifications can be effected without departing from the spirit and scope of the invention as described hereinabove.

We claim:

1. In a process of developing an image in a light sensitive element comprising a support and a light sensitive copper material by contacting the copper material with a chemical developer comprising a reducing agent or physical developer comprising a metal salt and reducing agent therefor, the improvement comprising employing as said light sensitive copper material a light sensitive copper (I) complex represented by the formula:

1. $[CuL_nX]$ wherein L is a ligand selected from the group consisting of monodentate or polydentate neutral Lewis bases containing a Group V A or Group VI A donor atom;
   $n$ is an integer of from 1 to 3; and
   X is a monovalent coordinating reducing anion; or
2. $[CuL_m]X'$ wherein L is a ligand selected from the group consisting of monodentate and polydentate neutral Lewis bases containing a Group V A or Group VI A donor atom,
   $m$ is an integer selected from the group consisting of 2 and 4; and
   X' is a monovalent noncoordinating reducing anion.

2. In a process of developing an image in a light sensitive element comprising a support and a light sensitive copper material by contacting the copper material with a chemical developer comprising a reducing agent or physical developer comprising a metal salt and a reducing agent therefor, the improvement comprising imbibing into said support a light sensitive copper (I) complex represented by the formula:

1. $[CuL_nX]$ wherein L is a ligand selected from the group consisting of monodentate or polydentate neutral Lewis bases containing a Group V A or Group VI A donor atom;
   $n$ is an integer of from 1 to 3; and
   X is a monovalent coordinating reducing anion;
2. $[CuL_m]X'$ wherein L is a ligand selected from the group consisting of monodentate and polydentate neutral Lewis bases containing a Group V A or Group VI A donor atom,
*m* is an integer selected from the group consisting of 2 and 4; and
X' is a monovalent noncoordinating reducing anion.

3. In a process of developing an image in a light sensitive element comprising a support and a light sensitive copper material by contacting the copper material with a chemical developer comprising a reducing agent or physical developer comprising a metal salt and a reducing agent therefor, the improvement comprising coating said support with a light sensitive copper (I) complex represented by the formula:

1. $[CuL_nX]$ wherein L is a ligand selected from the group consisting of monodentate or polydentate neutral Lewis bases containing a Group V A or Group VI A donor atom;
*n* is an integer of from 1 to 3; and
X is a monovalent coordinating reducing anion; or
2. $[CuL_m]X'$ wherein L is a ligand selected from the group consisting of monodenate and polydentate neutral Lewis bases containing a Group V A or Group VI A donor atom;
*m* is an integer selected from the group consisting of 2 and 4; and
X' is a monovalent noncoordinating reducing anion mixed with a hydrophilic binder.

4. The process of claim 3 wherein the hydrophilic binder is cellulose acetate.

5. The process of claim 1 wherein L is a monodentate ligand having the formula $WR_3$ or $W(OR)_3$ wherein W is a Group V A donor atom and R is selected from the group consisting of alkyl containing from one to six carbon atoms and aryl containing from 6 to 12 carbon atoms.

6. The process of claim 1 wherein L is a monodentate ligand having the formula $W'(R')_2$ wherein W' is a Group VI A donor atom and R' is selected from the group consisting of alkyl containing from one to six carbon atoms and aryl containing from 6 to 12 carbon atoms.

7. The process of claim 1 wherein L is a bidentate ligand having the formula BWZ wherein B and W are independently selected from the group consisting of donor atoms from Group V A and donor atoms from Group VI A and Z represents the nonmetallic atoms necessary to complete the ligand.

8. The process of claim 1 wherein L is selected from the group consisting of 2,2'-bipyridine, 1,10-phenanthroline and dinitriles.

9. The process of claim 1 wherein L is a monodentate or polydentate ligand containing a member selected from the group consisting of nitrogen, phosphorous, arsenic, antimony, bismuth, sulfur, selenium and tellurium.

10. The process of claim 1 wherein X is an anion selected from the group consisting of $N_3$, $NO_3$, Cl, Br, I, $BH_4$ and $B_9H_{14}$.

11. The process of claim 1 wherein X' has the formula B(DEFG) wherein D, E, F, and G are independently selected from the group consisting of alkyl and aryl.

12. The process of claim 10 wherein D, E, F, and G are aryl.

13. The process of claim 1 wherein X' is selected from the group consisting of perchlorates, nitrate and tetrafluoroborate.

14. The process of claim 1 wherein the latent image is developed in a physical development bath comprising a metal salt and a reducing agent therefor.

15. The process of claim 14 wherein the physical development bath comprises a nickel or copper salt and a reducing agent therefor.

16. The process of claim 14 wherein the physical development bath comprises a silver salt and a reducing agent therefor.

17. The process of claim 1 wherein the latent image is developed by chemical development wherein the chemical developer comprises a reducing agent.

18. The process of claim 17 wherein the chemical development bath comprises a mixture of dimethylamine borane and ethanolamine.

19. In a process of developing an image in a light sensitive element comprising a support and a light sensitive copper material by contacting the copper material with a chemical developer comprising a reducing agent or physical developer comprising a metal salt and a reducing agent therefor, the improvement comprising employing as said light sensitive copper material a light sensitive copper (I) complex represented by the formula:

$[CuL_nX]$ wherein L is a ligand selected from the group consisting of monodenate or polydentate neutral Lewis bases containing a Group V A or Group VI A donor atom;
*n* is an integer of from 1 to 3; and
X is a monovalent coordinating reducing anion.

20. In a process of developing an image in a light sensitive element comprising a support and a light sensitive material by contacting the copper material with a chemical developer comprising a reducing agent or physical developer comprising a metal salt and a reducing agent therefor, the improvement comprising employing as said light sensitive copper material a light sensitive copper (I) complex represented by the formula:

$[CuL_m]X'$ wherein L is a ligand selected from the group consisting of monodentate and polydentate neutral Lewis bases containing a Group V A or Group VI A donor;
*m* is an integer selected from the group consisting of 2 and 4; and
X' is a monovalent noncoordinating reducing anion.

21. The process of claim 20 wherein L is a bidentate ligand and *n* is 2.

22. The process of claim 20 wherein L is a monodentate ligand and *n* is 4.

23. The process of claim 1 wherein the exposed substrate and complex are preheated prior to development.

24. The process of forming a printed circuit comprising

A. coating an electrically insulating substrate with a photosensitive copper (I) complex having a formula selected from the group consisting of
1. $[CuL_nX]$ wherein L is a ligand selected from the group consisting of monodentate and polydentate neutral Lewis bases containing a Group V A or Group VI A donor atom;
*n* is an integer of from 1 to 3; and
X is a monovalent coordinating reducing anion, or
2. $[CuL_m]X'$ wherein L is a ligand selected from the group consisting of monodentate and polydentate neutral Lewis bases containing a Group V A or Group VI A donor atom;

$m$ is an integer selected from the group consisting of 2 and 4; and

X' is a monovalent noncoordinating reducing anion,

B. imagewise exposing the coated substrate to actinic light; and

C. physically developing metal on the exposed areas from a physical development bath comprising a metal salt and a reducing agent therefor and building up the deposited metal by further depositing metal thereon by electroplating.

* * * * *

PO-1050
(5/69)

UNITED STATES PATENT OFFICE
CERTIFICATE OF CORRECTION

Patent No. 3,859,092 Dated January 7, 1975

Inventor(s) Henry J. Gysling and Richard S. Vinal

It is certified that error appears in the above-identified patent and that said Letters Patent are hereby corrected as shown below:

Column 1, line 28, after "sensitivity" insert a period --.--; Line 51, "photosensivie" should read --photosensitive--.

Column 3, line 23, "substitute" should read --substituted--.

Column 4, lines 25-27, "$BH_3CN$, $N_3$, $NO_3$, halide ions such as Cl, Br, and I, and boranes such as $BH_4$ and $B_9H_{14}$" should read --$BH_3CN^{\ominus}$, $N_3^{\ominus}$, $NO_3^{\ominus}$, halide ions such as $Cl^{\ominus}$, $Br^{\ominus}$, and $I^{\ominus}$, and boranes such as $BH_4^{\ominus}$ and $B_9H_{14}^{\ominus}$--.

Column 4, line 52, "thus" should read --Thus--.

Column 5, line 61, "J. Gl" should read --J. G.--

Column 6, line 33, "polyethylene" should read --poly(ethylene--.

Column 7, line 29, "ehter" should read --ether--; Line 46, "agent" should read --agents--; Line 47, after "increased", a comma --,-- should be inserted.

Column 7, last line, "tions" should read --ions--.

Column 8, line 5, "or" should read --of--.

Column 9, line 16, "ehtanol" should read --ethanol--.

Column 10, line 27, "waas" should read --was--.

Column 11, line 24, that part of formula reading "tolyphosphine" should read "tolylphosphine"; Line 58 "solit" should be --solid--.

PO-1050
(5/69)

UNITED STATES PATENT OFFICE
CERTIFICATE OF CORRECTION

Patent No. 3,859,092 Dated January 7, 1975

Inventor(s) Henry J. Gysling and Richard S. Vinal

It is certified that error appears in the above-identified patent and that said Letters Patent are hereby corrected as shown below:

Column 12, line 49, "fro" should read --for--.

Column 15, line 20, "developement" should read --development--.

Column 18, line 27, "monodenate" should read --monodentate--.

Signed and sealed this 13th day of May 1975.

(SEAL)
Attest:

RUTH C. MASON
Attesting Officer

C. MARSHALL DANN
Commissioner of Patents
and Trademarks